(12) United States Patent
Liang (10) Patent No.: US 12,424,211 B2
(45) Date of Patent: Sep. 23, 2025

(54) METHOD AND DEVICE FOR COMPRESSING FINITE-STATE TRANSDUCERS DATA

(71) Applicant: GUANGZHOU ZIIPIN NETWORK TECHNOLOGY CO., LTD, Guangdong (CN)

(72) Inventor: Zhenxing Liang, Guangdong (CN)

(73) Assignee: GUANGZHOU ZIIPIN NETWORK TECHNOLOGY CO., LTD, Guangdong (CN)

( * ) Notice: Subject to any disclaimer, the term of this patent is extended or adjusted under 35 U.S.C. 154(b) by 603 days.

(21) Appl. No.: 17/782,152

(22) PCT Filed: Mar. 3, 2021

(86) PCT No.: PCT/CN2021/078808
§ 371 (c)(1),
(2) Date: Jun. 2, 2022

(87) PCT Pub. No.: WO2022/021876
PCT Pub. Date: Feb. 3, 2022

(65) Prior Publication Data
US 2023/0005474 A1    Jan. 5, 2023

(30) Foreign Application Priority Data

Jul. 28, 2020 (CN) .......................... 202010737012.8

(51) Int. Cl.
*G10L 15/19* (2013.01)
*G10L 15/193* (2013.01)
*H03M 7/30* (2006.01)

(52) U.S. Cl.
CPC ............. *G10L 15/193* (2013.01); *H03M 7/30* (2013.01)

(58) Field of Classification Search
CPC .......... G10L 15/193; H03M 7/30; H03M 7/70
See application file for complete search history.

(56) References Cited

U.S. PATENT DOCUMENTS

| 5,583,500 A | 12/1996 | Allen et al. |
| 6,094,151 A | 7/2000 | Schwartz et al. |
| (Continued) | | |

FOREIGN PATENT DOCUMENTS

| CN | 1124889 A | 6/1996 |
| CN | 204272112 U | 4/2015 |
| (Continued) | | |

OTHER PUBLICATIONS

International Search Report for PCT/CN2021/078808 mailed May 31, 2021, ISA/CN.
(Continued)

*Primary Examiner* — Mark Villena
(74) *Attorney, Agent, or Firm* — Yue (Robert) Xu; Apex Attorneys at Law, LLP (57) ABSTRACT

A method and device for compressing FST data are provided. The method includes: acquiring to-be-compressed FST data, where the FST data includes state transition data and state data; decomposing the state transition data based on first data categories to acquire first decomposition data; decomposing the state data based on second data categories to acquire second decomposition data; sequentially arranging, for each of the first data categories, the first decomposition data of the first data category, to acquire first arrangement data of the first data category; alternately arranging the first arrangement data and the second decomposition data according to a sequential order used in the first arrangement data, to acquire second arrangement data; performing classification statistics on the first arrangement data and the second arrangement data to acquire index data; and com-
(Continued)

bining the first arrangement data, the second arrangement data, and the index data, to obtain the compressed FST data.

9 Claims, 6 Drawing Sheets

(56) References Cited

U.S. PATENT DOCUMENTS

| | | | |
|---|---|---|---|
| 7,661,138 | B1 | 2/2010 | Li |
| 9,865,254 | B1* | 1/2018 | Filimonov ............ G10L 15/02 |
| 9,966,066 | B1* | 5/2018 | Corfield ............ G10L 15/142 |
| 10,121,467 | B1* | 11/2018 | Gandhe ............ G06F 40/247 |
| 10,381,000 | B1 | 8/2019 | Filimonov et al. |
| 10,943,583 | B1* | 3/2021 | Gandhe ............ G10L 15/183 |
| 11,056,098 | B1* | 7/2021 | Gejji ............ H03M 7/702 |
| 11,158,307 | B1* | 10/2021 | Ghias ............ G06N 3/044 |
| 11,270,687 | B2* | 3/2022 | Hu ............ G10L 15/083 |
| 2006/0218161 | A1 | 9/2006 | Zhang et al. |
| 2007/0192104 | A1 | 8/2007 | Blewett et al. |
| 2009/0228502 | A1 | 9/2009 | Lambov |
| 2018/0233134 | A1* | 8/2018 | Yoon ............ G10L 15/02 |
| 2019/0268361 | A1* | 8/2019 | Blewett ............ G06F 21/57 |
| 2020/0357388 | A1* | 11/2020 | Zhao ............ G06N 3/08 |

FOREIGN PATENT DOCUMENTS

| | | |
|---|---|---|
| CN | 104636349 A | 5/2015 |
| CN | 104866981 A | 8/2015 |
| CN | 106651658 A | 5/2017 |
| CN | 108417222 A | 8/2018 |
| CN | 110704199 A | 1/2020 |
| CN | 111884659 A | 11/2020 |
| JP | H11266162 A | 9/1999 |
| WO | 2022021876 A1 | 2/2022 |

OTHER PUBLICATIONS

Wen Hou, etc., Analysis of Compressed Sensing Based CT Reconstruction with Low Radiation, 2014 IEEE International Symposium on Intelligent Signal Processing and Communication Systems (ISPACS) Dec. 1-4, 2014.

Tan En-min, etc., A Hybrid Prefix Encoding Method of Test Data Compression, Microelectronics & Computer vol. 33 No. 9 Sep. 2016.

* cited by examiner

METHOD AND DEVICE FOR COMPRESSING FINITE-STATE TRANSDUCERS DATA

This application is the national phase of International Application No. PCT/CN2021/078808, titled "METHOD AND DEVICE FOR COMPRESSING FINITE-STATE TRANSDUCERS DATA", filed on Mar. 3, 2021, which claims the priority to Chinese Patent Application No. 202010737012.8, titled "METHOD AND DEVICE FOR COMPRESSING FINITE-STATE TRANSDUCERS DATA", filed on Jul. 28, 2020 with the China National Intellectual Property Administration (CNIPA), both of which are incorporated herein by reference in its entirety.

FIELD

The present disclosure relates to the technical field of natural language processing, and in particular to a method and device for compressing finite-state transducer (FST) data.

BACKGROUND

In applications such as speech recognition, full-text retrieval, and input methods in the technical field of natural language processing, after acquiring input information, a search engine searches dictionary indexes according to the input information, and then outputs some matching results. Since the dictionary indexes are used as a target library for search, the search algorithm depends on the data structure of the dictionary indexes, and involves a search speed and the matching results.

Figure 1:
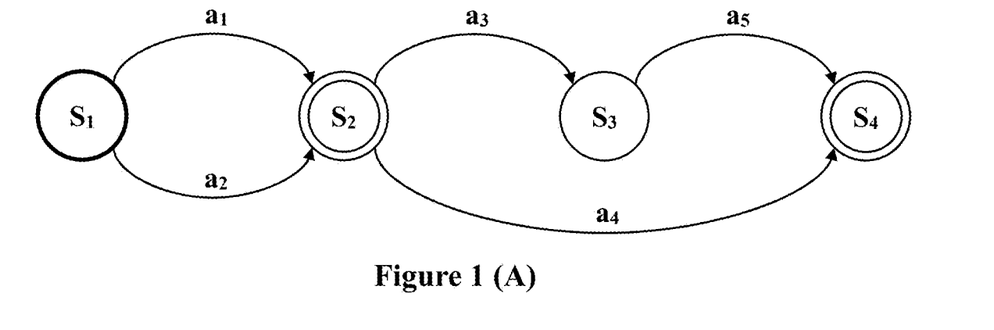
FIG. 1(A) is a schematic diagram showing a simple FST structure.
FIG. 1(B) is a schematic diagram showing a data structure of FST data shown in FIG. 1(A)

The finite-state transducer (FST) is a data structure of the dictionary indexes. FIG. 1(A) is a schematic diagram showing a simple FST structure, which mainly includes states $S_1$ to $S_4$ and state transitions (arcs) $a_1$ to $a_5$. The states include a start state mark and some final state marks. FIG. 1(B) is a schematic diagram showing a simple data structure of FST. State transition data includes signal label data (label), weight data (weight) and next state identifier data (next state). State data includes attached state transition identifier data. State data of a state marked as final further includes final weight data. The FST data includes a large amount of redundant data, and is generally stored in a client device for a long time. In a case of limited resources in the client device, the large amount of redundant data may result in a shortage of memory resources in the client device. Therefore, it is important to optimize the method for compressing the FST data.

Figure 4:
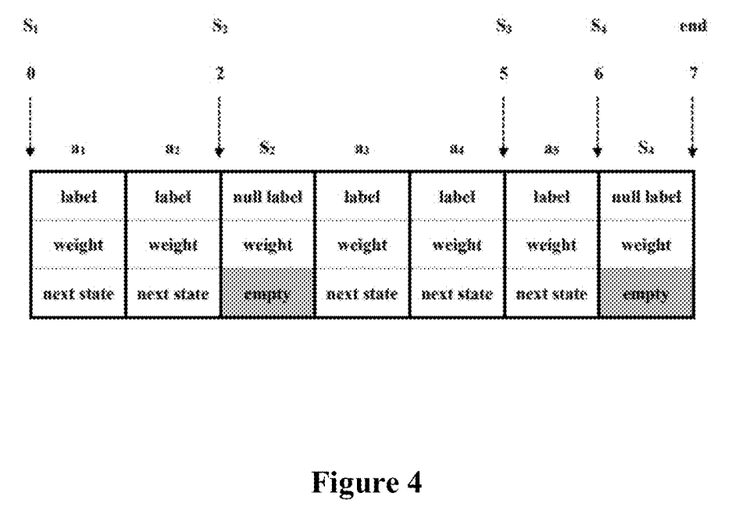
FIG. 4 is a schematic diagram showing a data structure of FST data compressed by the conventional data compression method.

In the conventional data compression method, a final weight of the state marked as final is wrapped as a weight of the state transition, to generate compressed data in a unified format to be stored. FIG. 4 is a schematic diagram showing a data structure of the FST data compressed by the conventional data compression method. By the above method, the data may be compressed to some extent. However, in the process of wrapping the final weight of the final state, in order to maintain the consistent format of the compressed data, a next state identifier that originally does not exist in the state is packaged inside the compressed data, resulting in a waste of data space. In addition, in a case that none of the state transitions includes a weight, a weight that originally does not exist in the state transition is still packaged inside the compressed data by the above method, resulting in a further waste of the data space.

Therefore, it is desired to provide an efficient method for compressing FST data.

SUMMARY

In view of this, a method and device for compressing FST data are provided according to the present disclosure, to effectively reduce space occupied by the FST data, thereby solving the technical problem of a waste of data space.

A method for compressing FST data is provided according to a first aspect of the present disclosure. The method for compressing FST data includes: acquiring to-be-compressed FST data, where the FST data includes state transition data and state data; decomposing the state transition data based on first data categories to acquire first decomposition data; decomposing the state data based on second data categories to acquire second decomposition data; sequentially arranging, for each of the first data categories, the first decomposition data of the first data category, to acquire first arrangement data of the first data category; alternately arranging the first arrangement data and the second decomposition data according to a sequential order used in the first arrangement data, to acquire second arrangement data; performing classification statistics on the first arrangement data and the second arrangement data to acquire index data; and combining the first arrangement data, the second arrangement data, and the index data, to obtain the compressed FST data.

Optionally, the decomposing the state transition data based on first data categories to acquire first decomposition data includes: decomposing the state transition data based on data categories of signal label, weight and next state identifier, to acquire signal label decomposition data, weight decomposition data and next state identifier decomposition data.

Optionally, before the decomposing the state transition data based on first data categories to acquire first decomposition data, the method for compressing FST data further includes: setting data types of the first decomposition data based on a maximum value of signal label and a total number of all states in the to-be-compressed FST data.

Optionally, after the decomposing the state transition data based on first data categories to acquire first decomposition data, the method for compressing FST data further includes: removing output signal label decomposition data from the signal label decomposition data in a case that information presented by the FST data is suitable to be presented by FSA data; and removing the weight decomposition data in a case that the information presented by the FST data is suitable to be presented by Trie data.

Optionally, the decomposing the state data based on second data categories to acquire second decomposition data includes: decomposing state data of each final state based on data categories of null label and final weight, to acquire null label decomposition data and final weight decomposition data, where the final state is a state marked as final.

Optionally, the sequentially arranging, for each of the first data categories, the first decomposition data of the first data category, to acquire first arrangement data of the first data category includes: sequentially arranging the signal label decomposition data in a sequential order of state identifiers corresponding to the signal label decomposition data, to acquire signal label arrangement data; sequentially arranging the weight decomposition data in a sequential order of state identifiers corresponding to the weight decomposition data, to acquire weight arrangement data; and sequentially arranging the next state identifier decomposition data in a sequential order of state identifiers corresponding to the next state identifier decomposition data, to acquire next state identifier arrangement data.

Optionally, the alternately arranging the first arrangement data and the second decomposition data according to a sequential order used in the first arrangement data, to acquire second arrangement data includes: alternately arranging the signal label arrangement data and the null label decomposition data in a sequential order of state identifiers corresponding to the signal label arrangement data and the null label decomposition data, to acquire signal label mixed arrangement data; and sequentially arranging the final weight decomposition data in a sequential order of state identifiers corresponding to the final weight decomposition data, to acquire final weight arrangement data.

Optionally, the performing classification statistics on the first arrangement data and the second arrangement data to acquire index data includes: performing classification statistics on the first arrangement data based on state identifiers corresponding to the first arrangement data to acquire first index data; and performing classification statistics on the second arrangement data based on state identifiers corresponding to the second arrangement data to acquire second index data.

Optionally, before the performing classification statistics on the first arrangement data and the second arrangement data to acquire index data, the method for compressing FST data further includes: setting a data type of the index data based on a maximum count of state transitions belonging to a same state, wherein the maximum count is a total number of state transitions belonging to a state with most transitions among all states in the to-be-compressed FST data.

Optionally, the combining the first arrangement data, the second arrangement data, and the index data, to obtain the compressed FST data includes: combining the weight arrangement data, the next state identifier arrangement data, the signal label mixed arrangement data, the final weight arrangement data and the index data, to obtain the compressed FST data.

A device for compressing FST data is provided according to a second aspect of the present disclosure. The device for compressing FST data includes an acquisition unit, a first decomposition unit, a second decomposition unit, a first arrangement unit, a second arrangement unit, a classification statistics unit, and a combination unit. The acquisition unit is configured to acquire to-be-compressed FST data. The FST data includes state transition data and state data. The first decomposition unit is configured to decompose the state transition data based on first data categories to acquire first decomposition data. The second decomposition unit is configured to decompose the state data based on second data categories to acquire second decomposition data. The first arrangement unit is configured to sequentially arrange, for each of the first data categories, the first decomposition data of the first data category, to acquire first arrangement data of the first data category. The second arrangement unit is configured to alternately arrange the first arrangement data and the second decomposition data according to a sequential order used in the first arrangement data, to acquire second arrangement data. The classification statistics unit is configured to perform classification statistics on the first arrangement data and the second arrangement data to acquire index data. The combination unit is configured to combine the first arrangement data, the second arrangement data, and the index data, to obtain the compressed FST data.

It can be seen from the above technical solutions that the method for compressing FST data according to the present disclosure has the following advantages.

The method for compressing FST data according to the present disclosure includes: acquiring to-be-compressed FST data, where the FST data includes state transition data and state data; decomposing the state transition data based on first data categories to acquire first decomposition data; decomposing the state data based on second data categories to acquire second decomposition data; sequentially arranging, for each of the first data categories, the first decomposition data of the first data category, to acquire first arrangement data of the first data category; alternately arranging the first arrangement data and the second decomposition data according to a sequential order used in the first arrangement data, to acquire second arrangement data; performing classification statistics on the first arrangement data and the second arrangement data to acquire index data; and combining the first arrangement data, the second arrangement data, and the index data, to obtain the compressed FST data.

According to the present disclosure, the state transition data of the FST data is decomposed based on the first data categories to acquire the first decomposition data, and the state data of the FST data is decomposed based on the second data categories to acquire the second decomposition data. Then, for each of the first data categories, the first decomposition data of the first data category is sequentially arranged to acquire first arrangement data of the first data category. Then, the first arrangement data and the second decomposition data are alternately arranged according to a sequential order used in the first arrangement data to acquire second arrangement data. Then, classification statistics is performed on the first arrangement data and the second arrangement data to acquire index data. Finally, the first arrangement data, the second arrangement data, and the index data are combined to obtain the compressed FST data. In the process, the FST data is decomposed and arranged in a fine-grained manner, without filling redundant data. Compared with the conventional data compression method in which redundant data is required in order to maintain the consistent format of the compressed data, the space occupied by the FST data is effectively reduced, thereby solving the technical problem of the waste of data space.

BRIEF DESCRIPTION OF THE DRAWINGS

In order to more clearly illustrate technical solutions in embodiments of the present disclosure, the drawings to be used in the description of the embodiments are briefly described below. It is apparent that the drawings in the following description are only drawings used in some embodiments of the present disclosure, and other drawings may be acquired by those skilled in the art from the drawings without any creative work.

DETAILED DESCRIPTION OF EMBODIMENTS

A method and device for compressing FST data are provided according to embodiments of the present disclosure, to effectively reduce space occupied by the FST data, thereby solving the technical problem of the waste of data space.

The technical solutions in the embodiments of the present disclosure are described clearly and completely in conjunction with the drawings in the embodiments of the present disclosure hereinafter, so that those skilled in the art can better understand the technical solutions of the present disclosure. It is apparent that the described embodiments are only some rather than all embodiments of the present disclosure. All other embodiments acquired by those skilled in the art based on the embodiments of the present disclosure without any creative work fall within the protection scope of the present disclosure.

First, some terms used in the description of the embodiments of the present disclosure are explained as follows.

Trie is an ordered prefix tree with the same prefix.

FSA is short for Finite-State Automaton that includes no output signal label.

Data type constrains the values that an expression, defines the operations that can be done on the data, the meaning of the data, and the way values of that type can be stored.

Figure 2:
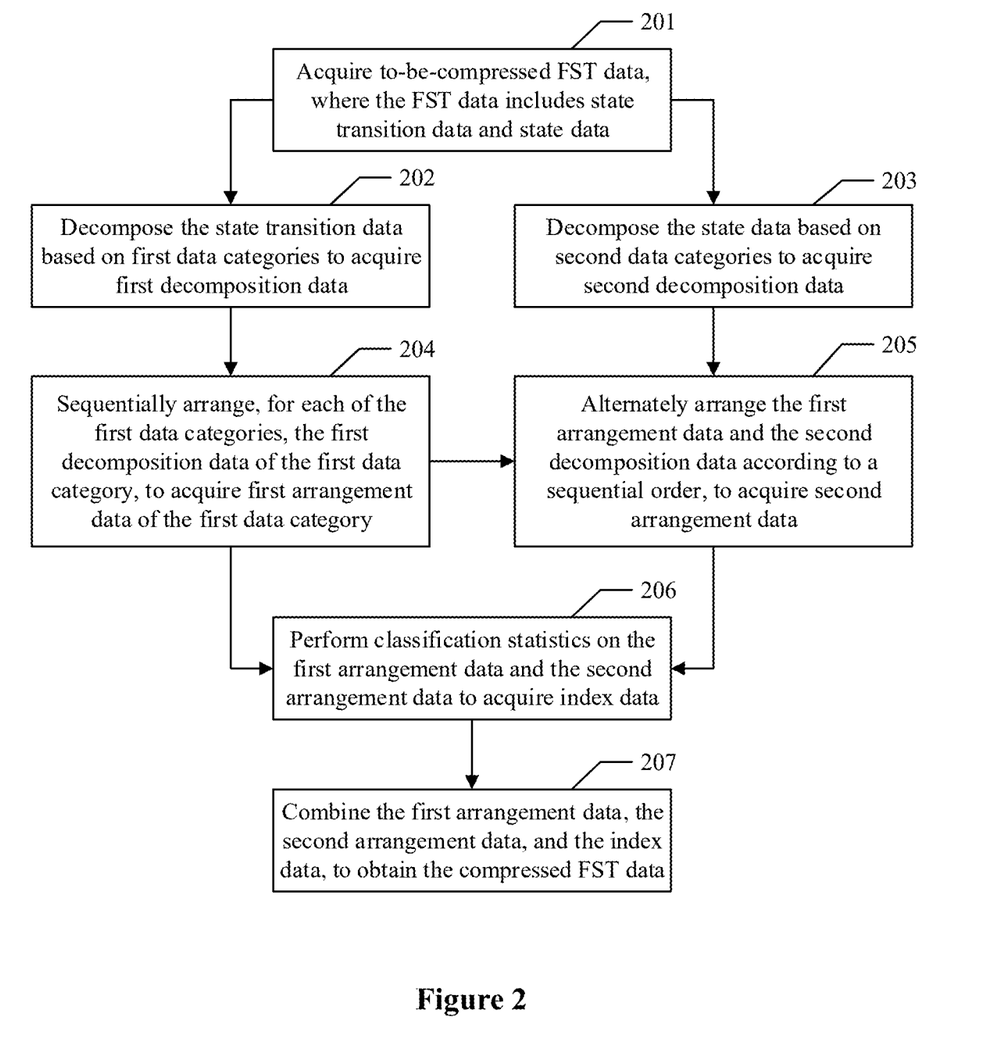
FIG. 2 is a schematic flowchart of a method for compressing FST data according to a first embodiment of the present disclosure.

Reference is made to FIG. 2, which is a schematic flowchart of a method for compressing FST data according to a first embodiment of the present disclosure.

The method for compressing FST data according to the first embodiment includes the following steps 201 to 207.

In step 201, to-be-compressed FST data is acquired. The FST data includes state transition data and state data.

The to-be-compressed FST data is acquired first in order to compress the FST data.

It should be noted that although different FST data may have different structures, each FST structure includes states, state transitions, signal labels, weights, next state identifiers, a start state mark and final state marks, as shown in FIG. 1(A). As shown in FIG. 1(B), FST data corresponding to the above FST structure includes state transition data and state data. The state transition data includes signal label data, weight data and next state identifier data. The state data includes final weight data and attached state transition identifier data. For each state transition, a state to which the state transition is attached may be determined based on the attached state transition identifier data in the state data.

For example, in FIG. 1(A), a sign $S_1$ represents a state, a sign $a_i$ represents a state transition, a circle sign in bold represents a start state, and a double-circle sign represents a final state. The sign for the final state also represents a final weight, and the sign for the state transition also represents the signal label and the weight.

In step 202, the state transition data is decomposed based on first data categories to acquire first decomposition data.

The state transition data structure is different from the state data structure. In the conventional data compression method, the state transition data and the state data are unified in a format, resulting in redundant data. In this embodiment, data is decomposed instead of being unified, and then is arranged separately or arranged in a mixed manner based on categories of the decomposed data. Therefore, the state transition data in the FST data is first decomposed in a fine-grained manner based on the first data categories, to acquire fine-grained first decomposition data.

For example, referring to the FST structure shown in FIG. 1(A), the FST data corresponding to the FST structure may be processed as follows in step 202.

Data of the state transitions $a_1$ to $a_5$ is decomposed based on data categories of signal label, weight and next state identifier, to acquire signal label decomposition data of the state transitions $a_1$ to $a_5$, weight decomposition data of the state transitions $a_1$ to $a_5$ and next state identifier decomposition data of the state transitions $a_1$ to $a_5$.

In step 203, the state data is decomposed based on second data categories to acquire second decomposition data.

In this embodiment, when the state transition data is decomposed, the state data is also decomposed in the fine-grained manner based on the second data categories, to acquire fine-grained second decomposition data.

For example, referring to the FST structure shown in FIG. 1(A), the FST data corresponding to the FST structure may be processed as follows in step 203.

Data of the states $S_2$ and $S_4$ marked as final in the state data is decomposed based on data categories of null label and final weight, to acquire null label decomposition data of the states $S_2$ and $S_4$ and final weight decomposition data of the states $S_2$ and $S_4$.

In step 204, for each of the first data categories, the first decomposition data of the first data category is sequentially arranged to acquire first arrangement data of the first data category.

For example, the first decomposition data acquired from the above step 202 may be processed as follows in step 204. The signal label decomposition data of the state transitions $a_1$ to $a_5$ is sequentially arranged in a sequential order of state identifiers corresponding to the signal label decomposition data, to acquire signal label arrangement data in an order of a signal label of the state transition $a_1$, a signal label of the state transition $a_2$, a signal label of the state transition $a_3$, a signal label of the state transition $a_4$, and a signal label of the state transition $a_5$. The weight decomposition data of the state transitions $a_1$ to $a_5$ is sequentially arranged in a sequential order of state identifiers corresponding to the weight decomposition data, to acquire weight arrangement data in an order of a weight of the state transition $a_1$, a weight of the state transition $a_2$, a weight of the state transition $a_3$, a weight of the state transition $a_4$, and a weight of the state transition $a_5$. The next state identifier decomposition data of the state transitions $a_1$ to $a_5$ is sequentially arranged in a sequential order of state identifiers corresponding to the next state identifier decomposition data, to acquire next state identifier arrangement data in an order of a next state identifier of the state transition $a_1$, a next state identifier of the state transition $a_2$, a next state identifier of the state transition $a_3$, a next state identifier of the state transition $a_4$, and a next state identifier of the state transition $a_5$.

In step 205, the first arrangement data and the second decomposition data are alternately arranged according to a sequential order used in the first arrangement data to acquire second arrangement data.

For example, the first arrangement data acquired from the above step 204 and the second decomposition data acquired from the above step 203 may be processed as follows in step 205. The signal label arrangement data of the state transitions $a_1$ to $a_5$ in the first arrangement data and the null label decomposition data of the states $S_2$ and $S_4$ in the second decomposition data are mixed, and are alternately arranged in a sequential order of state identifiers corresponding to the signal label arrangement data and the null label decomposition data, to acquire signal label mixed arrangement data in an order of the signal label of the state transition $a_1$, the signal label of the state transition $a_2$, a null label of the state $S_2$, the signal label of the state transition $a_3$, the signal label of the state transition $a_4$, the signal label of the state transition $a_5$, and a null label of the state $S_4$. The final weight decomposition data of the states $S_2$ and $S_4$ is sequentially arranged in a sequential order of state identifiers corresponding to the final weight decomposition data, to acquire final weight arrangement data in an order of a final weight of the state $S_2$, and a final weight of the state $S_4$.

In step 206, classification statistics is performed on the first arrangement data and the second arrangement data to acquire index data.

For example, the first arrangement data acquired from the above step 204 and the second arrangement data acquired from the above step 205 may be processed as follows in step 206. Classification statistics is performed on the signal label arrangement data in the first arrangement data based on state identifiers corresponding to the signal label arrangement data to acquire first index data having index values of $S_1$:2, $S_2$:2, $S_3$:1, $S_4$: 0. Classification statistics is performed on the signal label mixed arrangement data in the second arrangement data based on state identifiers corresponding to the signal label mixed arrangement data, to acquire second index data having index values of $S_1$:2, $S_2$:3, $S_3$:1, $S_4$: 1.

In step 207, the first arrangement data, the second arrangement data, and the index data are combined to obtain the compressed FST data.

For example, the first arrangement data acquired from the above step 204, the second arrangement data acquired from the above step 205, and the index data acquired from the above step 206 may be processed as follows in step 207. The weight arrangement data and the next state identifier arrangement data in the first arrangement data, the signal label mixed arrangement data and the final weight arrangement data in the second arrangement data, and the index data are combined, to obtain the compressed FST data.

The finally obtained compressed data is arranged as follows: $S_1$:2, $S_2$:3, $S_3$:1, $S_4$:1, the signal label of the state transition $a_1$, the signal label of the state transition $a_2$, the null label of the state $S_2$, the signal label of the state transition $a_3$, the signal label of the state transition $a_4$, the signal label of the state transition $a_5$, the null label of the state $S_4$, the weight of the state transition $a_1$, the weight of the state transition $a_2$, the weight of the state transition $a_3$, the weight of the state transition $a_4$, the weight of the state transition $a_5$, the next state identifier of the state transition $a_1$, the next state identifier of the state transition $a_2$, the next state identifier of the state transition $a_3$, the next state identifier of the state transition $a_4$, the next state identifier of the state transition $a_5$, the final weight of the state $S_2$, and the final weight of the state $S_4$.

In this embodiment, the state transition data of the FST data is decomposed based on the first data categories to acquire the first decomposition data, and the state data of the FST data is decomposed based on the second data categories to acquire the second decomposition data. Then, for each of the first data categories, the first decomposition data of the first data category is sequentially arranged to acquire the first arrangement data of the first data category. Then, the first arrangement data and the second decomposition data are alternately arranged according to the sequential order used in the first arrangement data to acquire the second arrangement data. Then, classification statistics is performed on the first arrangement data and the second arrangement data to acquire index data. Finally, the first arrangement data, the second arrangement data, and the index data are combined to obtain the compressed FST data. In the process, the FST data is decomposed and arranged in a fine-grained manner, without filling redundant data. Compared with the conventional data compression method in which redundant data is required in order to maintain the consistent format of the compressed data, the space occupied by the FST data is effectively reduced, thereby solving the technical problem of the waste of data space.

The method for compressing FST data according to the first embodiment of the present disclosure is described above, and a method for compressing FST data according to a second embodiment of the present disclosure is described below.

Figure 3:
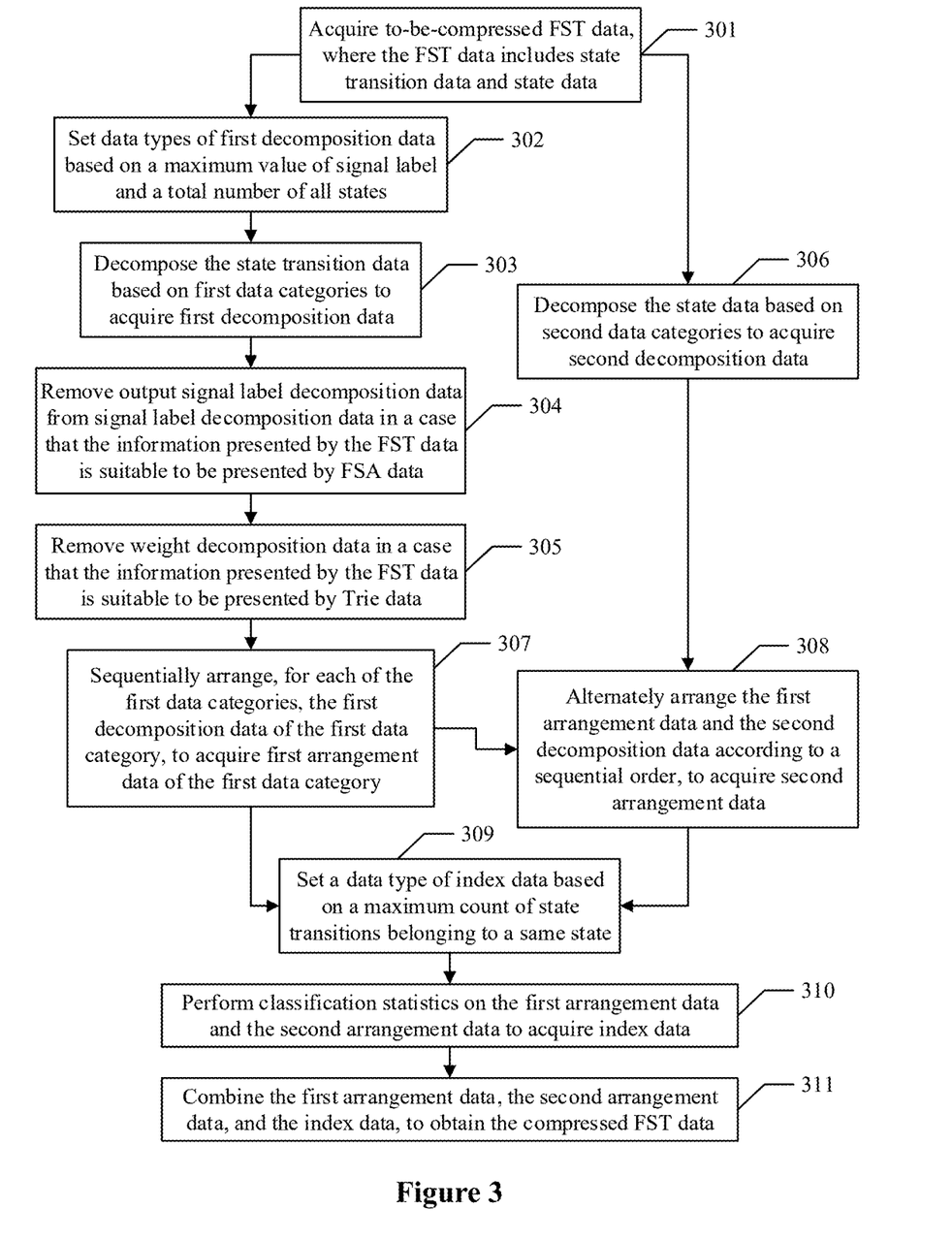
FIG. 3 is a schematic flowchart of a method for compressing FST data according to a second embodiment of the present disclosure.

Reference is made to FIG. 3, which is a schematic flowchart of the method for compressing FST data according to the second embodiment of the present disclosure.

The method for compressing FST data according to the second embodiment includes the following steps 301 to 311.

In step 301, to-be-compressed FST data is acquired. The FST data includes state transition data and state data.

It should be noted that the step 301 is the same as the step 201 in the first embodiment. For details of step 301, one may refer to the description of step 201, which is not repeated here.

In step 302, data types of the first decomposition data are set based on a maximum value of signal label and a total number of all states in the to-be-compressed FST data.

In the conventional technical solutions, the state transition data in the FST data has a unified data type which requires a large space. A data type of the signal label is 32-bit Integer, a data type of the next state identifier is 32-bit Integer, and a data type of the weight is 32-bit Float, which may result in a waste of data space. In this embodiment, an appropriate data type is set for each category of the state transition data in the FST data. In this embodiment, a numerical range of each category of the state transition data is first evaluated. That is, the numerical range of the signal label data, the numerical range of the weight data, and the numerical range of the next state identifier data are evaluated. Then, for each category of the state transition data, an appropriate data type is determined based on the maximum value in the numerical range of the category of the state transition data, so that any values of the signal label data, the weight data, and the next state identifier data in the state transition data in their respective numerical ranges have corresponding values of their respective data types.

For example, the data types are set as follows in step 302. If the signal label has a maximum value of 127, and has a numerical range of 0 to 127, then the data type of the signal label is set to be 7-bit Integer. If the total number of all states is 4, and the numerical range of the state identifiers is from 0 to 3, then the data type of the next state identifier is set to be 2-bit Integer. If the weight has a numerical range of 0 to 255, then the data type of the weight is set to be 8-bit Integer.

In step 303, the state transition data is decomposed based on first data categories to acquire first decomposition data.

It should be noted that the step 303 is the same as the step 202 in the first embodiment. For details of step 303, one may refer to the description of step 202, which is not repeated here.

In step 304, output signal label decomposition data is removed from the signal label decomposition data in a case that information presented by the FST data is suitable to be presented by FSA data.

In the FST data, each of the signal label data includes input signal label data and output signal label data. In a case that the FSA structure is presented according to the FST data structure, a value of the input signal label data is equal to a value of the output signal label data.

For example, in a case that the appropriate data structure of the FST data is simplified or changes to the data structure of FSA data, in data of each state transition, a value of the input signal label data is equal to a value of the output signal label data. In this case, the output signal label decomposition data in the signal label decomposition data may be removed as redundant data so as to reduce the space occupied by the FST data.

In step 305, the weight decomposition data is removed in a case that the information presented by the FST data is suitable to be presented by Trie data.

In a case that the Trie structure is presented according to the FST data structure, for any state, a path from the start state to this state is unique. That is, a set of state transitions on the path is unique. That is, a value obtained by adding a final weight of a target state to a sum of weights of all state transitions on the path from the start state to the target state is fixed. Therefore, the weights of all the state transitions may be transferred and added to the final weight of the target state.

For example, in a case that the Trie structure is presented according to the FST data structure, it is possible that none of the state transition data in the FST data includes meaningful weight data. In this case, the weight data may be removed as redundant data so as to further reduce the space occupied by the FST data.

In step 306, the state data is decomposed based on second data categories to acquire second decomposition data.

It should be noted that the step 306 is the same as the step 203 in the first embodiment. For details of step 306, one may refer to the description of step 203, which is not repeated here.

In step 307, for each of the first data categories, the first decomposition data of the first data category is sequentially arranged to acquire first arrangement data of the first data category.

It should be noted that the step 307 is the same as the step 204 in the first embodiment. For details of step 307, one may refer to the description of step 204, which is not repeated here.

In step 308, the first arrangement data and the second decomposition data are alternately arranged according to a sequential order used in the first arrangement data to acquire second arrangement data.

It should be noted that the step 308 is the same as the step 205 in the first embodiment. For details of step 308, one may refer to the description of step 205, which is not repeated here.

In step 309, a data type of the index data is set based on a maximum count of state transitions belonging to a same state.

It should be noted that the maximum count is a total number of state transitions, that all belonging to a state with most transitions among all states in the to-be-compressed FST data.

Figure 5:
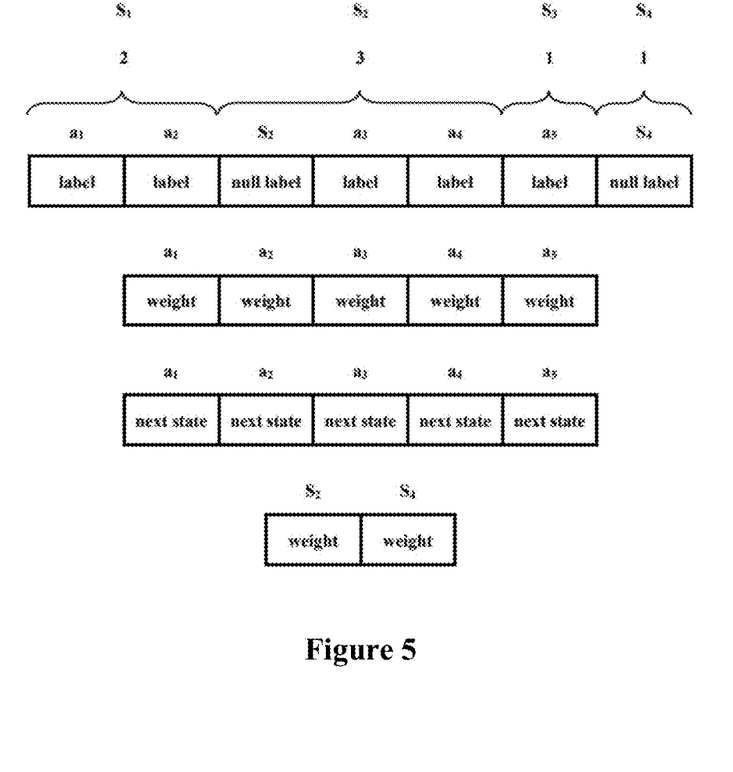
FIG. 5 is a schematic diagram showing a data structure of FST data compressed by the compression method according to embodiments of the present disclosure.

In the conventional technical solutions, the index data of the FST data has an absolute address offset data type which has a large numerical range and requires a large space, as shown in FIG. 4. This data type of the index data is generally 8-bit Integer, 16-bit Integer, or 32-bit Integer, resulting in a waste of data space. In this embodiment, an appropriate data type is set for the index data of the FST data based on the condition of the FST data. Since the maximum number of state transitions belonging to a single state is limited, and generally does not exceed the maximum value of signal label, a relative address offset data type which has a small numerical range and requires a small space is determined, as shown in FIG. 5.

For example, the data type of the index data may be set as follows in step 309. The number of attached state transitions of each state is as follows. The state $S_1$ has 2 attached state transitions. The state $S_2$ has 2 attached state transitions. The state $S_3$ has 1 attached state transition. The state $S_4$ has no attached state transition. Therefore, the maximum number of attached state transitions of a state among the all states is 2. Considering that there may be a null label to be counted, the maximum number of the attached state transitions is determined to be 3. Therefore, the index data has a numerical range from 0 to 3, and the data type of the index data is 2-bit Integer.

In step 310, classification statistics is performed on the first arrangement data and the second arrangement data to acquire the index data.

It should be noted that the step 310 is the same as the step 206 in the first embodiment. For details of step 310, one may refer to the description of step 206, which is not repeated here.

In step 311, the first arrangement data, the second arrangement data, and the index data are combined to obtain the compressed FST data.

It should be noted that the step 311 is the same as the step 207 in the first embodiment. For details of step 311, one may refer to the description of step 207, which is not repeated here.

FIG. 4 is a schematic diagram showing an arrangement structure of FST data compressed by the conventional data compression method. FIG. 5 is a schematic diagram showing an arrangement structure of FST data compressed by the data compression method according to this embodiment. Comparing the compressed data acquired by the different compression methods, it can be found that, the data space occupied by the data compressed by this embodiment is less than that compressed by the conventional method by two data units of the next state identifier, and is further reduced by applying appropriate data types. In a case of complex data structure of the FST data, the space saved by the technical solutions of the present disclosure is considerable.

In this embodiment, the state transition data of the FST data is decomposed based on the first data categories to acquire the first decomposition data, and the state data of the FST data is decomposed based on the second data categories to acquire the second decomposition data. Then, for each of the first data categories, the first decomposition data of the first data category is sequentially arranged to acquire first arrangement data of the first data category. Then, the first arrangement data and the second decomposition data are alternately arranged according to the sequential order used in the first arrangement data to acquire the second arrangement data. Then, classification statistics is performed on the first arrangement data and the second arrangement data to acquire the index data. Finally, the first arrangement data, the second arrangement data, and the index data are combined to obtain the compressed FST data. In the process of decomposing the state transition data based on the first data categories to acquire the first decomposition data, the data types of the first decomposition data may be set based on the maximum value of signal label and the total number of all states, and the output signal label decomposition data and the weight decomposition data are removed depending on the appropriate data structure of the FST data. In the process of performing classification statistics on the first arrangement data and the second arrangement data to acquire index data, the data type of the index data may be set based on the maximum count of state transitions belonging to a same state. In the process, the FST data is decomposed and arranged in a fine-grained manner, without filling redundant data. Compared with the conventional data compression method in which redundant data is required in order to maintain the consistent format of the compressed data, the space occupied by the FST data is effectively reduced, thereby solving the technical problem of the waste of data space.

The method for compressing FST data according to the second embodiment of the present disclosure is described above, and a device for compressing FST data is described below according to an embodiment of the present disclosure.

Figure 6:
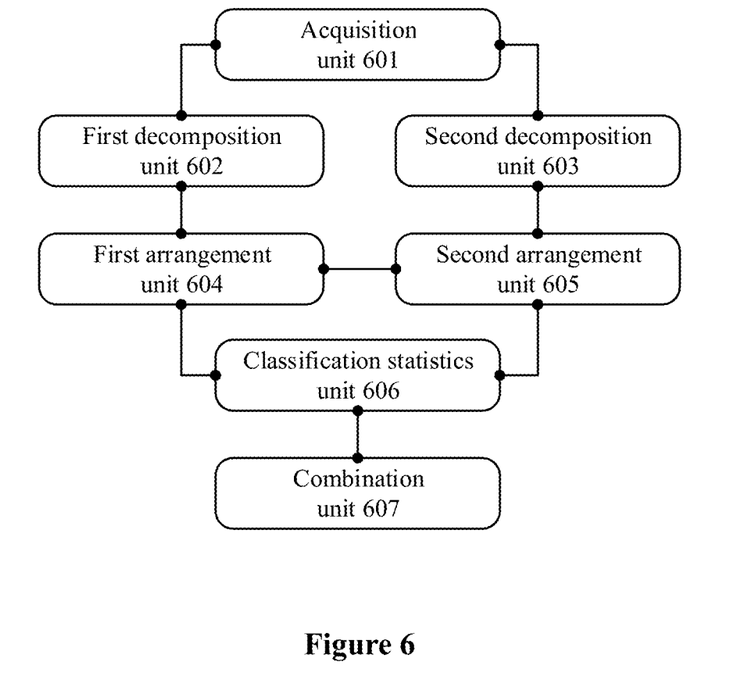
FIG. 6 is a schematic structural diagram of a device for compressing FST data according to an embodiment of the present disclosure.

Reference is made to FIG. 6, which is a schematic structural diagram of a device for compressing FST data according to an embodiment of the present disclosure. The device for compressing FST data includes an acquisition unit 601, a first decomposition unit 602, a second decomposition unit 603, a first arrangement unit 604, a second arrangement unit 605, a classification statistics unit 606, and a combination unit 607.

The acquisition unit 601 is configured to acquire to-be-compressed FST data. The FST data includes state transition data and state data.

The first decomposition unit 602 is configured to decompose the state transition data based on first data categories to acquire first decomposition data.

The second decomposition unit 603 is configured to decompose the state data based on second data categories to acquire second decomposition data.

The first arrangement unit 604 is configured to sequentially arrange, for each of the first data categories, the first decomposition data of the first data category, to acquire first arrangement data of the first data category.

The second arrangement unit 605 is configured to alternately arrange the first arrangement data and the second decomposition data according to a sequential order used in the first arrangement data, to acquire second arrangement data.

The classification statistics unit 606 is configured to perform classification statistics on the first arrangement data and the second arrangement data to acquire index data.

The combination unit 607 is configured to combine the first arrangement data, the second arrangement data, and the index data, to obtain the compressed FST data.

In this embodiment, the state transition data of the FST data is decomposed based on the first data categories to acquire the first decomposition data, and the state data of the FST data is decomposed based on the second data categories to acquire the second decomposition data. Then, for each of the first data categories, the first decomposition data of the first data category is sequentially arranged to acquire the first arrangement data of the first data category. Then, the first arrangement data and the second decomposition data are alternately arranged according to the sequential order used in the first arrangement data to acquire the second arrangement data. Then, classification statistics is performed on the first arrangement data and the second arrangement data to acquire index data. Finally, the first arrangement data, the second arrangement data, and the index data are combined to obtain the compressed FST data. In the process, the FST data is decomposed and arranged in a fine-grained manner, without filling redundant data. Compared with the conventional data compression method in which redundant data is required in order to maintain the consistent format of the compressed data, the space occupied by the FST data is effectively reduced, thereby solving the technical problem of the waste of data space.

Those skilled in the art should clearly understand that, detailed operating processes of the above device and units correspond to the processing in the foregoing method embodiments, and are not repeated here for convenience and conciseness of the description.

In the embodiments of the present disclosure, it should be understood that the device and method disclosed herein may be implemented in other manners. For example, the device embodiments described above are illustrative only. For example, the units are divided merely in logical functions, and may be divided in other manners in actual implementation. For example, multiple units or components may be combined or integrated into another device, or some features may be ignored or not performed. In addition, the shown or discussed coupling, direct coupling or communication connection between parts may be via some interfaces, and the indirect coupling or communication connection of devices or units may be in electrical, mechanical or other forms.

Units described as separate components may or may not be physically separated. Components shown as units may or may not be physical units. That is, these components may be located in same place or may be distributed on multiple network units. The object of the technical solutions of the embodiment may be achieved by selecting a part or all of the units according to actual requirements.

Furthermore, functional units in embodiments of the present disclosure may be separate physical units or may be integrated into one processing unit. Alternatively, two or more units may be integrated into one unit. The integrated unit may be implemented in a form of hardware, or may be implemented in a form of software functional unit.

In a case that the integrated unit is implemented as an independent product in the form of software functional unit for sale or use, the integrated unit may be stored in a computer readable storage medium. Based on such understandings, the technical solutions or part of the technical solutions disclosed in the present disclosure that makes contributions to the conventional technology or all or part of the technical solutions may be embodied in the form of a software product. The software product may be stored in a storage medium. The software product includes a number of instructions that control a computer device (which may be a personal computer, a server, or a network device and the like) to execute all or part of the steps of the methods according to the embodiments of the present disclosure. The above storage medium includes various mediums capable of storing program code, for example, a U disk, a mobile hard disk, a read only memory (ROM), a random access memory (RAM), a magnetic disk, or a compact disc.

The above embodiments are only intended for describing the technical solutions of the present application, and should not be interpreted as limitation to the technical solutions. Although the technical solutions are described in detail with references to the embodiments above, those skilled in the art should understand that the technical solutions according to the above embodiments may be modified, or some technical features may be substituted with the equivalents. Such modifications or substitutions do not cause the essence of the technical solutions to deviate from the spirit and scope of the technical solutions according to the embodiments of the present disclosure.

The invention claimed is:

1. A method for compressing finite-state transducer (FST) data to reduce memory usage in a computing device, comprising:
acquiring to-be-compressed FST data, wherein the FST data comprises state transition data and state data, and wherein the FST data is used in at least one of text retrieval, search engine, natural language processing, machine translation, speech recognition, signal processing and automated control;
decomposing the state transition data based on first data categories to acquire first decomposition data, comprising:
decomposing the state transition data based on data categories of signal label, weight and next state identifier, to acquire signal label decomposition data, weight decomposition data and next state identifier decomposition data;
after decomposing the state transition data based on the first data categories to acquire the first decomposition data, removing output signal label decomposition data from the signal label decomposition data in a case that information presented by the FST data is suitable to be presented by finite-state automaton (FSA) data; and removing the weight decomposition data in a case that the information presented by the FST data is suitable to be presented by Trie data;
decomposing the state data based on second data categories to acquire second decomposition data;
sequentially arranging, for each of the first data categories, the first decomposition data of the first data category, to acquire first arrangement data of the first data category;
alternately arranging the first arrangement data and the second decomposition data according to a sequential order used in the first arrangement data, to acquire second arrangement data;
performing classification statistics on the first arrangement data and the second arrangement data to acquire index data; and
combining the first arrangement data, the second arrangement data, and the index data, to obtain the compressed FST data, wherein the compressed FST data is stored in a memory of the computing device and reduces memory resource consumption during the at least one of text retrieval, search engine, natural language processing, machine translation, speech recognition, signal processing and automated control.

2. The method for compressing FST data according to claim 1, wherein the sequentially arranging, for each of the first data categories, the first decomposition data of the first data category, to acquire first arrangement data of the first data category comprises:
sequentially arranging the signal label decomposition data in a sequential order of state identifiers corresponding to the signal label decomposition data, to acquire signal label arrangement data;
sequentially arranging the weight decomposition data in a sequential order of state identifiers corresponding to the weight decomposition data, to acquire weight arrangement data; and
sequentially arranging the next state identifier decomposition data in a sequential order of state identifiers corresponding to the next state identifier decomposition data, to acquire next state identifier arrangement data.

3. The method for compressing FST data according to claim 2, wherein the decomposing the state data based on second data categories to acquire second decomposition data comprises:
decomposing state data of each final state based on data categories of null label and final weight, to acquire null label decomposition data and final weight decomposition data, wherein the final state is a state marked as final.

4. The method for compressing FST data according to claim 3, wherein the alternately arranging the first arrangement data and the second decomposition data according to a sequential order used in the first arrangement data, to acquire second arrangement data comprises:
alternately arranging the signal label arrangement data and the null label decomposition data in a sequential order of state identifiers corresponding to the signal label arrangement data and the null label decomposition data, to acquire signal label mixed arrangement data; and
sequentially arranging the final weight decomposition data in a sequential order of state identifiers corresponding to the final weight decomposition data, to acquire final weight arrangement data.

5. The method for compressing FST data according to claim 4, wherein the combining the first arrangement data, the second arrangement data, and the index data, to obtain the compressed FST data comprises:
combining the weight arrangement data, the next state identifier arrangement data, the signal label mixed arrangement data, the final weight arrangement data and the index data, to obtain the compressed FST data.

6. The method for compressing FST data according to claim 1, wherein before the decomposing the state transition data based on first data categories to acquire first decomposition data, the method for compressing FST data further comprises:
setting data types of the first decomposition data based on a maximum value of signal label and a total number of all states in the to-be-compressed FST data.

7. The method for compressing FST data according to claim 1, wherein the performing classification statistics on the first arrangement data and the second arrangement data to acquire index data comprises:
performing classification statistics on the first arrangement data based on state identifiers corresponding to the first arrangement data to acquire first index data; and
performing classification statistics on the second arrangement data based on state identifiers corresponding to the second arrangement data to acquire second index data.

8. The method for compressing FST data according to claim 7, wherein before the performing classification statistics on the first arrangement data and the second arrangement data to acquire index data, the method for compressing FST data further comprises:
setting a data type of the index data based on a maximum count of state transitions belonging to a same state, wherein the maximum count is a total number of state transitions belonging to a state with most transitions among all states in the to-be-compressed FST data.

9. A device for compressing finite-state transducer (FST) data to reduce memory usage in a computing device, comprising:

an acquisition unit configured to acquire to-be-compressed FST data, wherein the FST data comprises state transition data and state data, and wherein the FST data is used in at least one of text retrieval, search engine, natural language processing, machine translation, speech recognition, signal processing and automated control;

a first decomposition unit configured to decompose the state transition data based on first data categories to acquire first decomposition data, comprising:
 decomposing the state transition data based on data categories of signal label, weight and next state identifier, to acquire signal label decomposition data, weight decomposition data and next state identifier decomposition data;

the first decomposition unit further configured to, after decomposing the state transition data based on the first data categories to acquire the first decomposition data, remove output signal label decomposition data from the signal label decomposition data in a case that information presented by the FST data is suitable to be presented by finite-state automaton (FSA) data; and remove the weight decomposition data in a case that the information presented by the FST data is suitable to be presented by Trie data;

a second decomposition unit configured to decompose the state data based on second data categories to acquire second decomposition data;

a first arrangement unit configured to sequentially arrange, for each of the first data categories, the first decomposition data of the first data category, to acquire first arrangement data of the first data category;

a second arrangement unit configured to alternately arrange the first arrangement data and the second decomposition data according to a sequential order used in the first arrangement data, to acquire second arrangement data;

a classification statistics unit configured to perform classification statistics on the first arrangement data and the second arrangement data to acquire index data; and a combination unit configured to combine the first arrangement data, the second arrangement data, and the index data, to obtain the compressed FST data, wherein the compressed FST data is stored in a memory of the computing device and reduces memory resource consumption during the at least one of text retrieval, search engine, natural language processing, machine translation, speech recognition, signal processing and automated control.

* * * * *